(12) United States Patent
Sievers

(10) Patent No.: US 9,744,619 B2
(45) Date of Patent: Aug. 29, 2017

(54) APPARATUS AND METHOD FOR MULTI-BEAM DIRECT ENGRAVING OF ELASTOMERIC PRINTING PLATES AND SLEEVES

(71) Applicant: Esko-Graphics Imaging GmbH, Itzehoe (DE)

(72) Inventor: Wolfgang Sievers, Kremperheide (DE)

(73) Assignee: Esko-Graphics Imaging GmbH, Itzehoe (DE)

( * ) Notice: Subject to any disclaimer, the term of this patent is extended or adjusted under 35 U.S.C. 154(b) by 486 days.

(21) Appl. No.: 14/201,848

(22) Filed: Mar. 8, 2014

(65) Prior Publication Data

US 2014/0327185 A1    Nov. 6, 2014

Related U.S. Application Data

(60) Provisional application No. 61/776,642, filed on Mar. 11, 2013.

(51) Int. Cl.
*B23K 26/067*    (2006.01)
*B41C 1/05*    (2006.01)
(Continued)

(52) U.S. Cl.
CPC .......... *B23K 26/0673* (2013.01); *B29C 59/16* (2013.01); *B41C 1/05* (2013.01);
(Continued)

(58) Field of Classification Search
CPC  B23K 26/0823; B23K 23/0673; B23K 26/16; B23K 26/142
See application file for complete search history.

(56) References Cited

U.S. PATENT DOCUMENTS 4,010,345 A * 3/1977 Banas ..................... B08B 15/04
                                              219/121.67
5,416,298 A * 5/1995 Robert ................. B23K 26/067
                                              219/121.68
(Continued)

FOREIGN PATENT DOCUMENTS

EP          1700691         9/2006
WO   WO 2008/088504 A1     7/2008

OTHER PUBLICATIONS

European Search Report for Application No. 14153432.1 (the EP counterpart) dated Mar. 16, 2015.
(Continued)

*Primary Examiner* — Matthew Daniels
(74) *Attorney, Agent, or Firm* — Dov Rosenfeld; Inventek

(57) ABSTRACT

Described herein are an apparatus and a method for direct engraving an elastomeric printing plate by multiple laser beams simultaneously. In one embodiment, an elastomeric printing plate or sleeve is positioned on an imaging drum for direct engraving. The imaging drum is rotatable around its longitudinal axis. Such rotation defines a circumferential direction, also called the transverse direction. The axis of rotation defines an axial direction, also called the longitudinal direction. The printing plate has an body and a surface made of an elastomer (made of polymer or rubber). A drive mechanism provides relative motion between a plurality of laser beams and the plate in both the transverse and longitudinal directions.

11 Claims, 12 Drawing Sheets

(51) Int. Cl.
*B29C 59/16* (2006.01)
*B41C 1/18* (2006.01)
*G03F 7/20* (2006.01)
*G03F 7/24* (2006.01)
*B29K 21/00* (2006.01)
*B29L 31/00* (2006.01)

(52) U.S. Cl.
CPC ............ B41C 1/182 (2013.01); G03F 7/2055 (2013.01); G03F 7/24 (2013.01); *B29K 2021/00* (2013.01); *B29L 2031/767* (2013.01)

(56) References Cited

U.S. PATENT DOCUMENTS

| | | | | |
|---|---|---|---|---|
| 5,798,867 | A * | 8/1998 | Uchida | B23K 26/067 359/618 |
| 6,008,468 | A * | 12/1999 | Tanaka | B23K 26/0823 219/121.7 |
| 6,087,625 | A * | 7/2000 | Iso | B23K 26/0673 219/121.6 |
| 6,150,629 | A | 11/2000 | Sievers | |
| 6,180,913 | B1 * | 1/2001 | Kolmeder | B23K 26/06 219/121.68 |
| 6,184,490 | B1 * | 2/2001 | Schweizer | B23K 26/067 219/121.74 |
| 6,403,920 | B1 * | 6/2002 | Muneyuki | B23K 26/04 219/121.77 |
| 6,489,589 | B1 * | 12/2002 | Alexander | A61C 1/0046 219/121.69 |
| 6,599,147 | B1 | 7/2003 | Mills et al. | |
| 8,365,662 | B2 | 2/2013 | Aviel et al. | |
| 2001/0050312 | A1 * | 12/2001 | Koide | B23K 26/18 235/454 |
| 2002/0195012 | A1 | 12/2002 | Juffinger et al. | |
| 2006/0065147 | A1 | 3/2006 | Ogawa | |
| 2006/0203861 | A1 | 9/2006 | Ogawa | |
| 2007/0199930 | A1 | 8/2007 | McElroy et al. | |
| 2008/0153038 | A1 | 6/2008 | Siman-Tov et al. | |
| 2011/0277649 | A1 | 11/2011 | Aviel et al. | |
| 2011/0278767 | A1 | 11/2011 | Aviel et al. | |

OTHER PUBLICATIONS

Kratky, A.; Schuöcker, D.; Liedl, G., "Processing with kW fibre lasers: advantages and limits," XVII International Symposium on Gas Flow, Chemical Lasers, and High-Power Lasers. Edited by Kratky, A.; Schuöcker, D.; Liedl, G. Proceedings of the SPIE, vol. 7131, pp. 71311X-71311X-12 (2008).

Stork Prints Group, "Direct Laser Engraving" 2012, Stork Prints Austria GmbH, Langkampfen, Austria. Retrieved Mar. 8, 2013 at http://andersonvreeland.com/wp-content/uploads/2012/02/Stork_DLE.pdf (Feb. 2012).

Isomet Corp, High power Modulation & Deflection of CO2 Lasers, Application note AN1101, Jun. 2005, Isomet Corporation, Springfield, VA. Retrieved Nov. 16, 2012 at http://liveweb.archive.org/http://www.isomet.com/FinalWebSite/PDFDocs/App_Notes/Using High Power Ge AO devices.pdf.

Isomet Corp, LS600-1011 High Power AO Deflector Isomet Corporation, Springfield, VA. Retrieved Jul. 20, 2015 at https://web.archive.org/web/20070714042236/http://www.isomet.com/FinalWebSite/PDFDocs/AO%20Sheets/LS600-1011.pdf, published on Jul. 14, 2007.

IPG Photonics Corporation, "YLR-SM Fiber Laser 2012 Series," IPG Photonics Corporation, Oxford, Massachusetts, at http://www.ipgphotonics.com/Collateral/Documents/English-US/YLR_SM_Series_IPG.pdf.

Crystal Technology AOM_Datasheet_4075-2 97-02823-02 Rev 0b, Sep. 23, 2004.

Kodak Flexcel Direct System Exceeds Customer Expectations with Innovative Direct Engraving Technology., Kodak Press Release Mar. 6, 2012 Issued by Eastman Kodak Co., Graphic Communications, for Pro-Digital Plus (Tradeshow), Feira Internacional de Lisboa, Lisbon, Portugal, Mar. 2012, retrieved Jul. 20, 2015 at http://www.kodak.com/ek/US/en/News_Media/News_Releases/KODAK_FLEXCEL_Direct_System_Exceeds_Customer_Expectations_with_Innovative_Direct_Engraving_Technology.htm.

* cited by examiner

APPARATUS AND METHOD FOR MULTI-BEAM DIRECT ENGRAVING OF ELASTOMERIC PRINTING PLATES AND SLEEVES

RELATED APPLICATION(S)

The present invention claims priority of U.S. Provisional Patent Application No. 61/776,642 filed 11 Mar. 2013 to Applicant Esko-Graphics Imaging GmbH, and inventor Sievers, the contents of which are incorporated herein by reference.

FIELD OF THE INVENTION

The present disclosure relates generally to the field of printing, and in particular to direct engraving of printing plates and sleeves.

BACKGROUND

Computer-to-plate (CTP) is an imaging technology used in printing processes, in which imaging data is output directly from a computer to a printing plate by exposing the printing plate to light energy according to the imaging data. In the case of an external drum imaging device, a printing plate or sleeve is positioned on an imaging cylinder of the imager. As the drum rotates around its longitudinal axis, an image head moves in the axial direction and focuses one or more laser beams modulated with imaging data onto the plate to image a pattern on the surface of the printing plate.

Although the description is in terms of imaging a plate on an external drum imaging device, the same principle applies to imaging a sleeve on the external drum imaging device, or to using a flat-bed imaging device.

It is known to image a photopolymer plate with a laser ablatable mask ("LAMS") coating thereon, in which case the laser beam or beams ablate a pattern in the LAMS material to form a mask through which the plate can be exposed to ultraviolet and processed to produce a printing plate with the image pattern indirectly engraved thereon.

In direct engraving, the laser beam or beams ablate the image pattern directly on an elastomeric printing plate. The term "elastomer" and the adjective "elastomeric" are used herein broadly to include a rubber plate and a polymer plate. The terms are used interchangeably with the term "rubber."

Direct engraving typically requires much higher laser energy than ablating a LAMS coating. While the typical thickness of a LAMS coating is in the order of 3 μm, direct engraving requires ablating plate material to produce a much deeper pattern, usually in the order of 500 μm deep. As a result, direct engraving of elastomeric plates requires about three orders of magnitude more laser power than does ablating a LAMS coating.

High power lasers, such as sealed-off carbon dioxide ($CO_2$) lasers and fiber lasers can provide output power up to kilowatts (kW) range, e.g., 500 W to 3 kW. Coherent, Inc., of Santa Clara, Calif., offers off-the-shelf 500 W and 1000 W $CO_2$ lasers. IPG Photonics Corporation, Oxford, Mass. offers off-the-shelf single-mode fiber lasers of up to 1000 W, and can make custom fiber lasers of up to 3 kW. Such lasers can engrave with satisfactory quality. However, imaging is relatively slow. Existing direct engraving systems have productivity around 0.5 square meters per hour ($m^2/h$), whereas imaging of photopolymer plates can achieve as fast as 8 $m^2/h$.

Direct engraving systems are known that use a $CO_2$ or fiber laser and an optical-beam modulator such as an acousto-optic modulator (AOM) to switch the laser-beam power on the plate on and off. The switching speed of an AOM is limited. High power lasers with an AOM have a switching speed that is merely in the low kilohertz (kHz) range. To achieve a speed of 8 $m^2/h$, however, requires a switching speed in a megahertz (MHz) range. In general, the higher the laser power, the slower the switching speed.

One expensive solution to the imaging speed limitation is to use several engraving systems in parallel. Such a solution however is expensive and requires a large space to operate the multiple engraving systems.

Beside the low productivity, direct engraving of an elastomeric plate can produce a large amount of evaporated elastomer. The vapour may disturb focusing of laser beams and form a plasma, which may cause melting of small details on the plate surface.

DESCRIPTION OF EXAMPLE EMBODIMENTS

Overview

Figure 1:
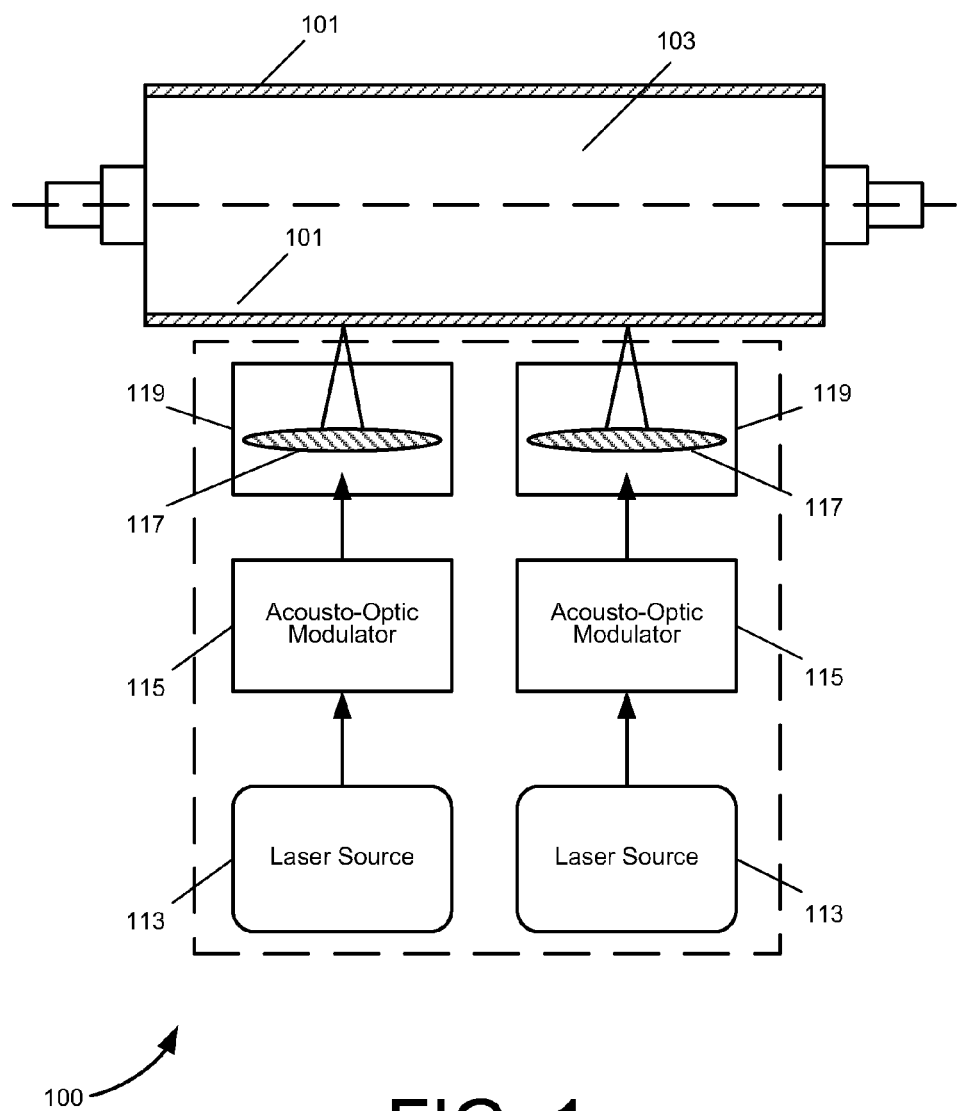
FIG. 1 is a simplified schematic diagram illustrating a prior art apparatus for direct engraving an elastomeric printing plate, in which two laser sources are used in parallel.

Described herein are an apparatus and a method for direct engraving an elastomeric printing plate by multiple laser beams. In one embodiment, an elastomeric printing plate or sleeve is positioned on an imaging drum for direct engraving. The imaging drum is rotatable around its longitudinal axis. Such rotation defines a circumferential direction, also called the transverse direction. The axis of rotation defines an axial direction, also called the longitudinal direction. The printing plate has an body and a surface made of an elastomer (made of polymer or rubber). A drive mechanism provides relative motion between a plurality of laser beams and the plate in both the transverse and longitudinal directions.

An alternate configuration uses a flat-bed imager. The plat bed has a transverse direction and a longitudinal direction perpendicular to the transverse direction. A drive mechanism provides relative motion between a plurality of laser beams and the plate in both the transverse and longitudinal directions. Each of the respective modulated beams is modulated according to a respective portion of the imaging data. The respective portions are called "slices" of the imaging data to reflect that each is operative to modulate a beam for engraving from a first respective depth to a second respective depth of the overall depth of engraving. The present description describes the drum version in detail. Those skilled in art will find it straightforward to adapt the description herein for a flat-bed imager.

Particular embodiments include an apparatus for multi-beam direct engraving including a laser source, the laser source when in operation emitting a laser beam. The apparatus also includes a beam splitter operative to split the laser beam into a plurality of split beams, an optical-beam modulator for each split beam operative to modulate the split beam to create one or more modulated beams, e.g., first-order modulated beams from the split beam, and a focusing lens for each split beam operative to focus the one or more modulated beams created from the split beam to create one or more focused modulated beams, the focused modulated beams propagating onto a printing plate or sleeve. Each focusing lens has a focal length and each focused modulated beam has a focal spot with a size, the focal spot pointing to a location on the surface of the printing plate or sleeve and into a depth level in the body of the printing plate or sleeve. At least two focusing lenses have different focal lengths and at least two focal spots point to different locations on the surface of the printing plate or sleeve and into different depth levels in the body of the printing plate or sleeve. Each of the modulated beams is modulated according to a respective portion of the imaging data. The respective portions are called "slices" of the imaging data to reflect that each is operative to modulate a beam for engraving from a first respective depth to a second respective depth of the overall depth of engraving. The modulated beams are parallel to each other such that the focal spots of the focused modulated beams build a row along the axial direction of the printing plate or sleeve.

In one embodiment, each beam splitter comprises a reflective surface having a reflectivity factor to reflect a portion up to the entirety of an incident laser beam according to the reflectivity factor. Each beam splitter also transmits an unreflected portion of the incident laser beam.

The optical-beam modulator may be an acousto-optic modulator (AOM) or an acousto-optic deflector (AOD) capable of generating one or more diffracted beams, e.g., first-order modulated beams from a split beam.

In some versions, the apparatus further include one or more reflectors arranged in the beam path between the optical-beam modulator and the focusing lens to reflect each modulated beam, such that the modulated beams from different split beams have closer distances to each other after reflection while remain parallel.

In some versions, the apparatus further includes a metal shield. Any space between the focusing lenses and the printing plate or sleeve is separated by the metal shield, the metal shield having openings to allow the focused modulated beams to propagate onto the printing plate or sleeve, the metal shield having a curvature having a normal vector toward the printing plate or sleeve, forming a Venturi nozzle that prevents dust from entering the space between the metal shield and the focusing lenses.

Particular embodiments also include a method for multi-beam direct engraving. The method includes emitting a laser beam from a laser source, splitting the laser beam by a beam splitter to create a plurality of split beams, modulating each split beam by an optical-beam modulator to create one or more modulated beams from the split beam, and focusing the one or more modulated beam by a focusing lens to create one or more focused modulated beams, the focused modulated beams propagating onto a printing plate or sleeve. Each focusing lens has a focal length and each focused modulated beam has a focal spot with a size, the focal spot pointing to a location on the surface of the printing plate or sleeve and into a depth level in the body of the printing plate or sleeve. At least two focusing lenses have different focal lengths and at least two focal spots point to different locations on the surface of the printing plate or sleeve and into different depth levels in the body of the printing plate or sleeve. The modulated beams are parallel to each other such that the focal spots of the focused modulated beams build a row along the axial direction of the printing plate or sleeve.

The apparatus and method described herein have an advantage of increasing productivity of a direct engraving system for elastomeric printing plates and avoiding melting of fine image details on elastomeric print plates during engraving operations.

Particular embodiments may provide all, some, or none of these aspects, features, or advantages. Particular embodiments may provide one or more other aspects, features, or advantages, one or more of which may be readily apparent to a person skilled in the art from the drawings, descriptions, and claims herein.

Example Embodiment(s)

FIG. 1 shows a prior art direct engraving apparatus 100 with an elastomeric printing plate or sleeve 101 positioned on an imaging drum 103 for direct engraving. The imaging drum 103 is rotatable around an axis. Such rotation defines a circumferential direction, and the axis defines an axial direction. The printing plate or sleeve 101 is made of elastomeric material and has an outer surface onto which a pattern is engraved according to imaging data. One prior-art version of a drum imager for direct engraving uses a single laser source. The prior-art direct engraving apparatus 100 uses two laser sources that operate on any point of a plate sequentially. Each direct engraving subsystem includes laser source, e.g., a $CO_2$ laser source 113, an acousto-optic modulator (AOM) 115, a focusing lens 117, and an extraction head 119 that encloses the focusing lens 117. A laser beam emitted from the laser source 113 is modulated by the AOM 117 according to the imaging data and then focused by the respective focusing lens 117 onto the printing plate or sleeve 101.

The prior art apparatus 100 is relatively expensive due to the use of two high power laser sources.

Another prior arrangement uses two subsystems to directly engrave in parallel.

Another prior art alternative that improves efficiency as measured, e.g., by the area engraved per unit time, is to use multiple engraver apparatuses in parallel. This of course is also expensive. Furthermore, a large space also is required for operating more than one direct engraving system.

Having high power in a laser beam results in evaporated rubber which may result in overheating at local areas of the printing plate by a plasma being formed, which may cause undesired melting of elastomer and diminish fine image details on the plate. A large amount of rubber vapor may also disturb the focusing of the beam.

In much of the remainder of the description, for the sake of brevity, the term "printing plate" or "plate" also covers a printing sleeve, a printing cylinder, and similar elements that are to be directly engraved by laser radiation for use for printing. Furthermore, while the description will be for an external drum imaging device, different embodiments of the invention are for use in a flat-bed imaging device. How to modify the details herein for a flat-bed imaging device would be straightforward to those skilled in the art without need for further description.

Embodiments of the invention include an apparatus having a single high power laser source, in some embodiments, a kW TEM00 mode fiber laser producing a single incident beam. The apparatus includes a set of one or more beam splitters to split the single incident beam into a plurality of split beams that in one version are parallel to each other, then individually modulated and focused to expose a printing plate at several point, e.g., collinear points in the longitudinal direction of the axis of rotation. Each of the split beams is modulated according to a respective portion ("slice") of the imaging data by an optical-beam modulator, such as an AOM in one embodiment, or an acousto-optical deflector (AOD) in another embodiment, to create one or more modulated output beams, e.g., first-order modulated beams per split beam.

Each modulated beam from each optical-beam modulator (AOM or AOD) has its own focusing lens subsystem to focus the modulated beam onto the printing plate. The focal points of the different focusing lens subsystems focus to different depth levels from the surface of the plate to provide different focal spot diameters. In this manner, ablation of the material of the plate takes place at and to different depth levels using the plurality of modulated beams. The first level carries fine details on the surface of the rubber material, each next levels is beneath the previous one and all forms the shoulders inside the rubber material which support the printing details on the top level.

The respective portion ("slice") imaging data for modulating each modulated beam is generated electronically by using depth information on the complete imaging data in an electronic process of "cutting" the complete imaging data into multiple slices of imaging data, each respective slice of imaging data being used to engrave the plate from a first depth to a second depth of the overall depth indicated by the imaging data. Details of the generation of control signals.

Figure 2A:
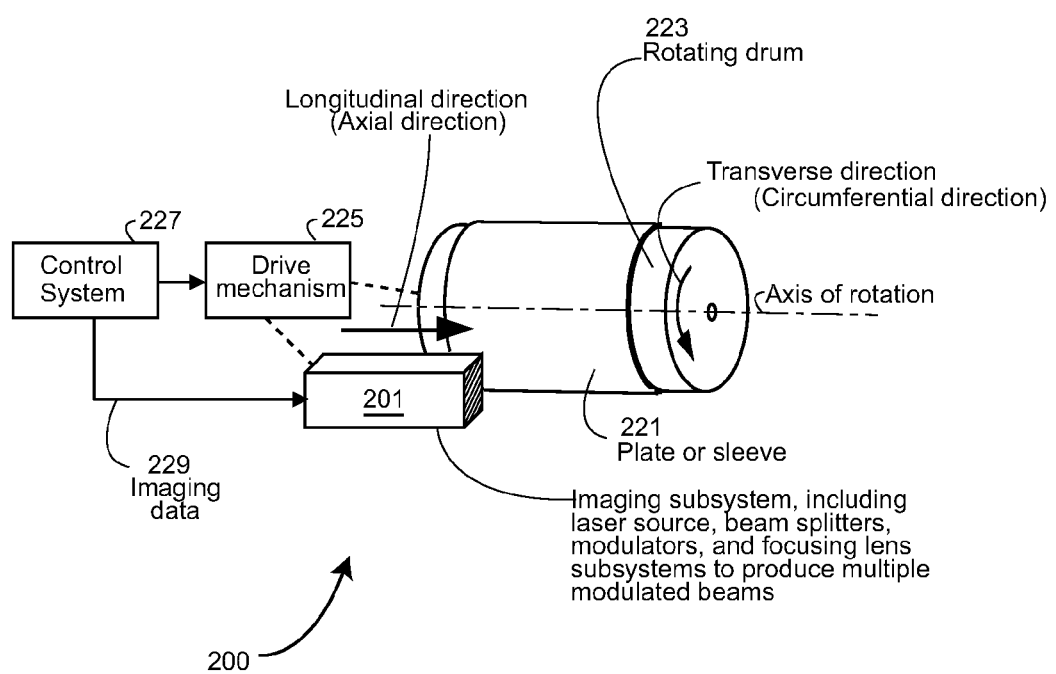
FIG. 2A shows a simplified block diagram of one embodiment of the invention in the form of an apparatus that includes a rotating drum with a elastomeric plate or sleeve thereon and an imaging subsystem comprising a laser source, beam splitters, modulators, and focusing lens subsystems to produce multiple modulated beams.

FIG. 2A shows a simplified block diagram of one embodiment of the invention in the form of an apparatus 200 that includes a rotating drum 223 with a elastomeric plate or sleeve 221 thereon. An imaging subsystem 201 includes the laser source, the one or more beam splitters, the optical-beam modulators, and the focusing optics to produce a plurality of modulated beams focused to different depts. from the outer surface of the plate or sleeve 221. A drive mechanism 225 rotates the drum and causes the modulated beams from the imaging subsystem to move in the direction parallel to the drum axis—what is called the longitudinal direction. A control system 227 is connected to the drive mechanism 225, and further to the optical-beam modulators. The control system 227 and the other elements of the apparatus are configured and operative such that the drive mechanism 225 under control of the control system 227 produces relative motion between the modulated beams from imaging subsystem 201 and the plate or sleeve 221. The control system 227 is further configured and operative to determine the slices of imaging data 229 to form control signals for the optical-beam modulators. The operation of the control system to determine the control signals for the optical beams is similar to that disclosed in commonly assigned U.S. Pat. No. 6,150,629 to common inventor Sievers, titled "Laser engraving system," issued Nov. 21, 2000, the contents of which are incorporated herein by reference.

Figure 2B:
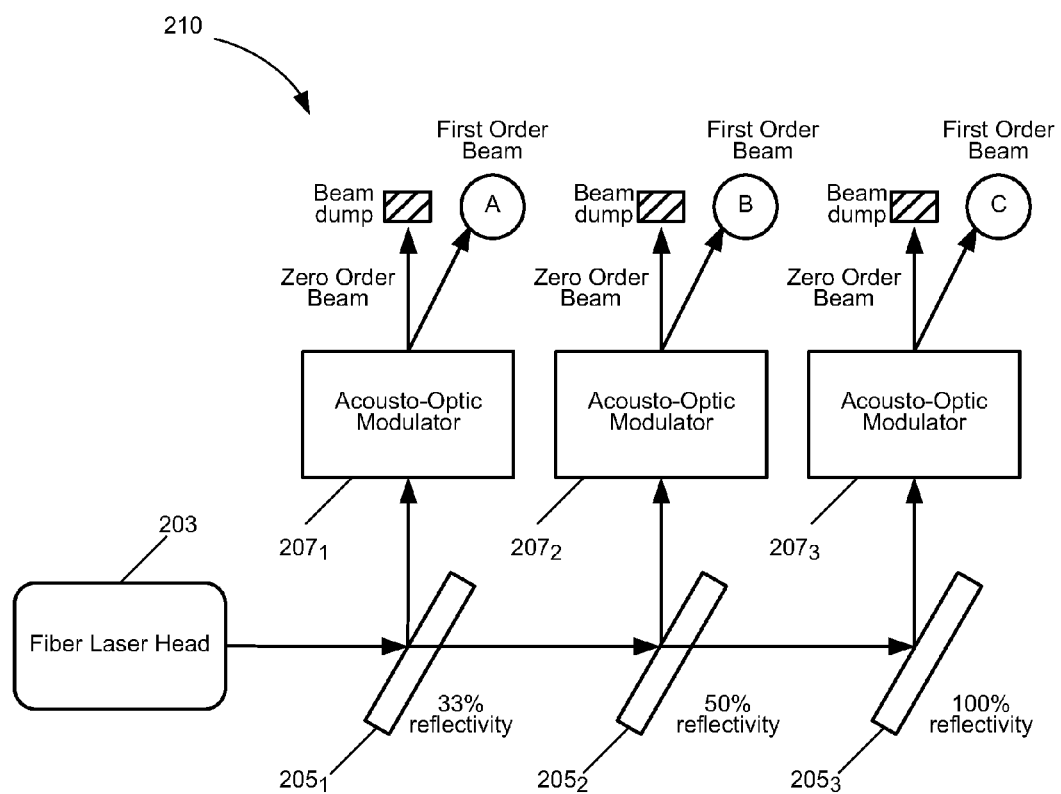
FIG. 2B is a simplified schematic diagram illustrating a first portion of an apparatus for multi-beam direct engraving an elastomeric printing plate using a single laser source, according to one embodiment of the present invention.
Figure 2C:
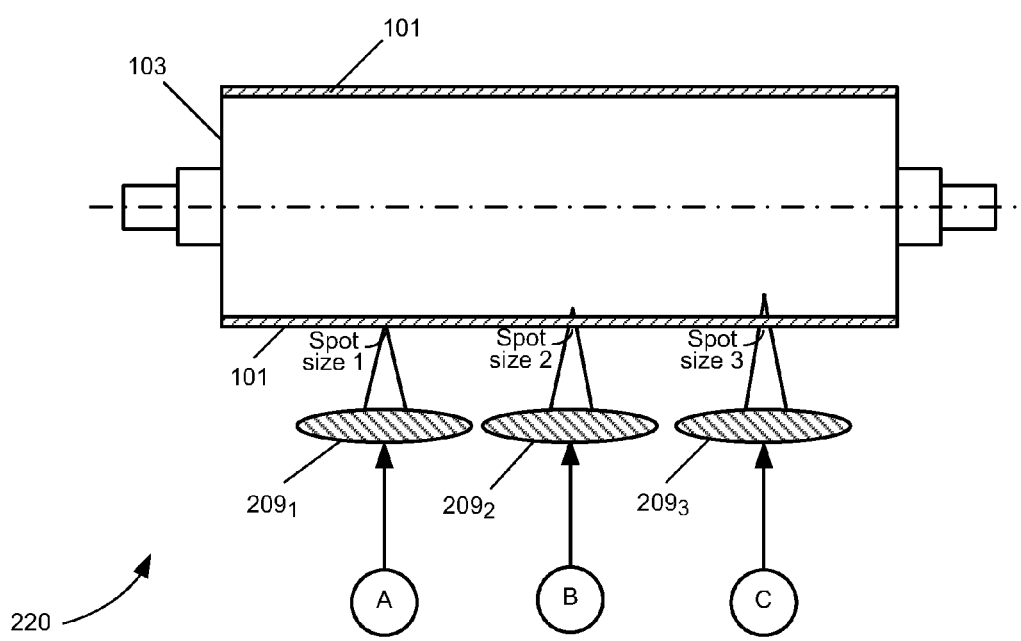
FIG. 2C is a simplified schematic diagram illustrating a second portion of the multi-beam direct engraving apparatus shown in FIG. 2B.

FIGS. 2B and 2C show in simplified form the imaging subsystem 201 of a multi-beam direct engraving apparatus 200 according to one embodiment of the present invention. FIG. 2B shows a first portion of the imaging subsystem 201 including a single laser source 203, a set of beam splitters, e.g., reflective mirrors—three reflective mirrors are shown, $205_1$, $205_2$, and $205_3$—all but the last one having a transmittance so that each functions as a beam splitter, and an acousto-optic modulator 207 for each reflective mirror $205_1$, $205_2$, $205_3$. When in operation, a laser beam emitted from the laser source 203 is split into a plurality of split beams by the set of reflective mirrors $205_1$, $205_2$, $205_3$. Each reflective mirror $205_1$, $205_2$, $205_3$ reflects a portion of its incident light, defined by a respective reflective factor that may be expressed as a percentage of the respective incident beam intensity that is reflected. The remaining light passed through, less any amount absorbed. The amount absorbed is typically negligible. In one embodiment, the mirrors $205_1$, $205_2$, $205_3$ are placed collinearly and cascaded such that any laser beam that passes through any of the reflective mirrors but the final in the cascade to provide incident light to the immediately next mirror in the cascading order. In one embodiment, the mirrors $205_1$, $205_2$, $205_3$ have different reflectivity factors. In one three-beam embodiment, the first mirror $205_1$ has a reflectivity factor of 33%, the second $205_2$ a reflectivity factor of 50%, and the final mirror $205_3$ in the cascading order has a 100% reflectivity, i.e., entirely reflects the incident light.

Each of the split beams is modulated by a respective optical-beam modulator in response to the control signals determined in the control system 227, such that each respective modulated beam output by the imaging subsystem is modulated by a respective portion—respective slice—of the imaging data, such that respective modulated beam engraves from a respective first depth to a respective second depth. In one embodiment, each of the split beams is modulated by an acousto-optic modulator (AOM) $207_1$, $207_2$, and $207_3$ to create a diffracted first-order beam that is modulated according to its respective slice of the imaging data. A beam dump is used for the zero'th order beam.

Figure 2D:
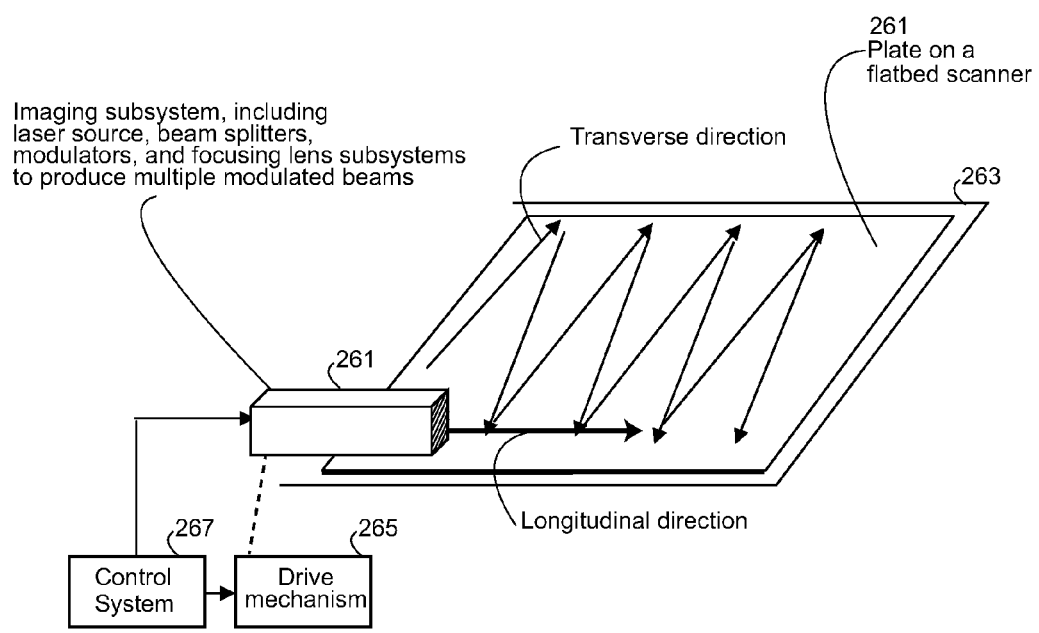
FIG. 2D shows a simplified block diagram of one embodiment of the invention in the form of an apparatus that includes a flat bed with a elastomeric plate or sleeve thereon and an imaging subsystem comprising a laser source, beam splitters, modulators, and focusing lens subsystems to produce multiple modulated beams.

In another embodiment, the plate is on a flat bed, e.g., of a flatbed scanner, also called an x-y table, and a drive mechanism is configured to produce relative motion between multiple beams produced by an imaging subsystem and the plate. In one such embodiment, the modulated beams move during imaging above the plate placed on a flatbed table. FIG. 2D shows a simplified block diagram of one embodiment of such a flatbed 261 in which an elastomeric plate 263 is directly engraved. The imaging subsystem 261 include a laser source, beams splitters, modulators and focusing optics to produce a plurality of beams (three or more) modulated according to a respective slice of the imaging data. A control system 267 is operative to form, from the imaging data, a respective control signal with which to modulate a respective modulator to generate multiple beams from the imaging subsystem 261. The control system 267 also is coupled to and configured to control a drive mechanism 265 that is configured to move the imaging subsystem 261 back and forth in a transverse direction while also moving the imaging subsystem 261 in a longitudinal direction.

In another flatbed embodiment (not shown), the light source moves during curing in a transverse direction and the plate moves during curing in a longitudinal direction perpendicular to the transverse axis.

To operate at a specified high efficiency, a direct engraving system requires an optical-beam modulator, e.g., an AOM that can operate at a sufficiently high switching speeds for modulating its split laser beam on and off according to its respective slice of the imaging data. The switching speed of an AOM is determined by the time that an acoustic wave needs to travel through the cross section of the optical beam. As such, it is determined by the velocity of the acoustic wave and the diameter of the cross section of the laser beam, also called the beam diameter. For small beam diameters, the acoustic wave needs only travel a small distance to penetrate the beam diameter, resulting in a higher switching and modulation speed compared to large beam diameters. However, small beam diameters may cause high light power concentration which will create partial heating of the optical material, causing thermal lensing and compromising laser beam quality. The high power concentration may also cause damage of the optical surface and material. This is especially the case for Germanium, which is a common crystal material for AOMs, e.g., AOMs for 10.6 μm wavelength CO2 lasers.

AOMs suitable for operation with fiber lasers are available from Gooch & Housego, Palo Alto, Calif., previously known as Crystal Technology, Inc., Palo Alto, Calif. Isomet Corporation of Springfield, Va., offers a 600 W Germanium AOD (model LS600-1011).

At the time of the present invention, the beam diameter for a single AOM is limited to a certain dimension, and the intensity of each split beam, e.g., the light power per AOM is limited to a certain level. The limitation on power per AOM and the diameter result from the size of the crystal incorporated in the AOM, and the ability to supply sufficient cooling in the case relatively large (and more expensive crystals) are used.

To provide a high level of light output from a direct engraving system, in embodiments of the invention, the laser power is distributed among a plurality of modulators, e.g., AOMs or AODs.

At the time of the present invention, AOMs for $CO_2$ lasers are mostly made of Germanium, which is more sensitive to thermal lensing and more expensive than, e.g., fiber lasers. Existing $CO_2$ lasers often have small instabilities in laser mode structure, pointing direction and output power due to the sensitivity. For this reason, some embodiments of the present invention use laser source 203 in the imaging subsystem 201 comprising a fiber laser. However, the inventions is not limited to using such a laser source, and another type of source that can provide the required power for engraving, even a $CO_2$ laser source may be used in alternate embodiments.

Thus, in some embodiments, the imaging subsystem 201 includes at least three splitters, e.g., at least three reflective mirrors $205_1$, $205_1$, $205_3$, each paired with an AOM $207_1$, $207_2$, $207_3$. The laser beam emitted from the fiber laser head is thus split into a plurality of at least three beams, and each split beam is modulated by a corresponding optical-beam modulator, e.g., AOM. Each split beam incident to an AOM has a smaller dimension and a smaller light intensity than the output of the fiber laser head. The mirrors $205_1$, $205_2$, $205_3$ and AOMs $207_1$, $207_2$, $207_3$ are placed such that the deflection is in the same plane as the folding of the mirrors $205_1$, $205_2$, $205_3$. FIG. 2B shows such an arrangement.

In the general case, denote the number of modulated beams by N, denote the n'th mirror by index n, so that the mirrors are denoted $205_1$, $205_2$, . . . , $205_N$. Denote the reflectivity factor of the n'th mirror by $R_n$, $1 \leq R_n \leq 0$ In one embodiment, $R_n = 1/(N-(n-1))$.

FIG. 2C is a simplified schematic diagram illustrating a second portion of the imaging subsystem 201 of the multi-beam direct engraving apparatus 200 of FIG. 2A. Each modulated beam output from an AOM $207_1$, $207_2$, $207_3$ is focused by a respective focusing subsystem $209_1$, $209_2$, $209_3$. For simplicity, the terms "lens" and "focusing lens" are used to indicate a focusing subsystem. Each lens $207_1$, $207_2$, $207_3$ has a respective focal length, and is designed to focus onto a point at a corresponding depth level from the plate's outer surface, and this creates a focal spot on the outer surface of the plate 221 whose focal-spot size, e.g., as measured by the diameter, varies according to the depth level of the focusing of the corresponding lens.

Engraving of the elastomeric plate 221 takes place at different depth levels. Each focused modulated beam is used to engrave to a corresponding depth level. That is, each focused beam can ablates the elastomer on the plate 221 from the surface into the body till its corresponding depth level. A first depth level presents fine image details on the surface of the plate 221. Each next depth level is deeper than its previous depth level and together form shoulders inside the elastomeric plate 221 supporting the fine images details on the first level.

Figure 3A:
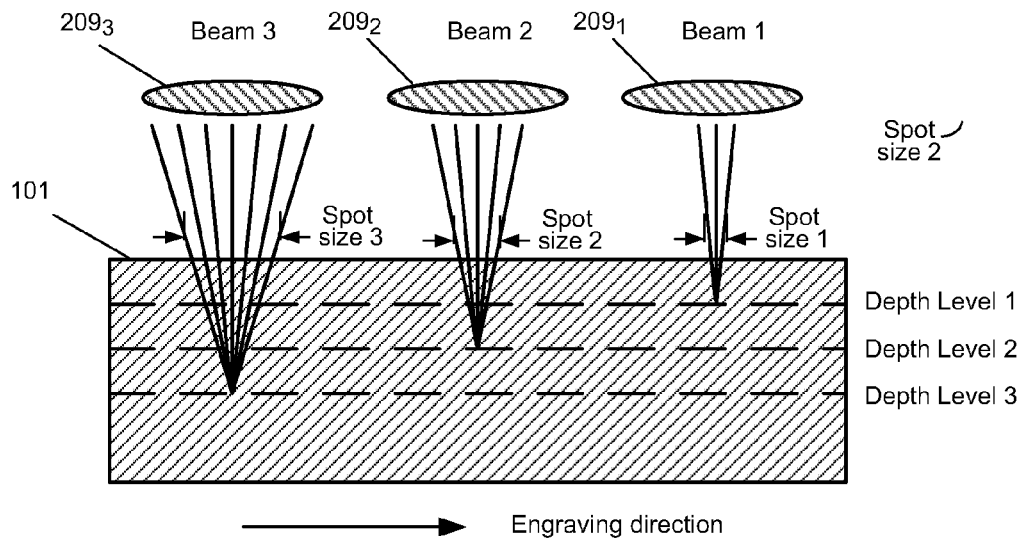
FIG. 3A is a simplified schematic diagram illustrating multiple laser beams focused into different depth levels in a printing plate when an apparatus shown in FIGS. 2B and 2C is in operation, wherein adjacent depth levels have equal distances.
Figure 3B:
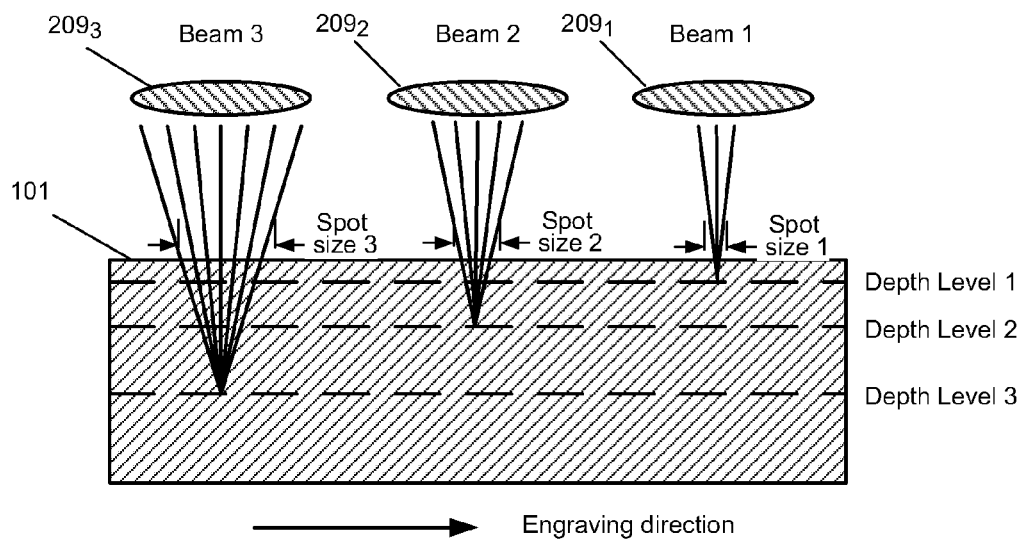
FIG. 3B is a simplified schematic diagram illustrating multiple laser beams focused into different depth levels in a printing plate when an apparatus shown in FIGS. 2B and 2C is in operation, wherein adjacent depth levels haven unequal distances.

FIGS. 3A and 3B illustrate views of the different engraving depth levels in the printing plate 221. FIG. 3A shows, in one example, a set of depth levels, shown as depth levels 1, 2, and 3, that are equally spaced in the axial (depth) dimension, have equal spaces between adjacent levels and divide the elastomer body to be engraved into layers having the same layer thickness. FIG. 3B shows, in another example, the depth levels that differ in spacing and divide the elastomer body to be engraved into layers with different layer thicknesses.

The first focused modulated beam denoted Beam 1 in FIGS. 3A and 3B is used to engrave the finest image details and has the smallest focal spot on the plate surface and the smallest depth of focus. The second beam denoted Beam 2 is used to engrave the coarser support shoulders and has a larger focal spot on the plate surface and a larger depth of focus. The third and last beam denoted Beam 3 is only for coarse patterns between the shoulder areas, and has the largest focal spot on the plate surface as well as the largest depth of focus. As described above, the modulation of a respective modulator is controlled by a respective control signal according to a respective slice of the full imaging data.

The focal lengths of the focusing lenses $209_1$, $209_2$, $209_3$ depend on the engraving depth levels and the focal spot sizes, and therefore also vary from one to another.

Engraving at different levels with separate beams makes it easier to determine a correct focal distance for all lenses $209_1$, $209_2$, $209_3$. Because the engraving of coarse patterns at depth levels 2 and 3 does not require a small focal spot, beam positioning in these focal distances need not be as accurate as for depth level 1.

The respective laser intensity dedicated to these different levels can be different. The engraving of depth level 1, which defines the finest image details on the surface of the printing plate 221, requires lower intensity than the other depth levels, and thus, in one embodiment, Beam 1 is controlled to have lower intensity that of the other beams. Using a lower intensity permits the use of a smaller beam diameter on the AOM $207_1$, $207_2$, $207_3$ without reaching the intensity at which there may be damage to the crystal, such intensity, expressed, e.g., in $W/mm^2$, called the damage threshold of the crystal. This provides a faster switching ability for the beam than if a higher intensity were used.

In one embodiment, a total of 750 W is distributed over three AOMs, the first AOM's beam being only 150 Watts for the fine details at the surface, the second AOM's beam being at 250 Watts for the deeper less detailed layer in the rubber or other material, and the third AOM's beam being at 350 Watts for the coarse engraving, since for such coarse engraving, the tolerance of focus spot deterioration due to thermal lensing can be less severe than for other depths.

The engraving of elastomeric material on the printing plate 221 is performed in consecutive steps to avoid overheating. At each step, only a part of the elastomeric material is ablated, which allows cooling off the material before a next engraving step is executed. By dividing the engraving process into several consecutive steps, removal of evaporated elastomer is more efficient, and melting effects in the elastomeric material can be avoided or greatly reduced.

The apparatus 201 thus provides a an efficient solution to increasing productivity of direct engraving an elastomeric printing plate 221 over using single beams, and further addresses the overheating problem. In one embodiment, the single laser source 203 is a fiber laser, and AOMs $207_1$, $207_2$, $207_3$ are made from Tellurium Dioxide ($TeO_2$) in a longitudinal crystal cut and have an acoustic velocity of 4.2 mm/μsec. The beam diameter is 2.5 mm, which is a reasonable size for applying up to 150 watts at about 1 μm wavelength. With the given velocity and beam diameter, the time for the acoustic wave to penetrate the laser beam in the crystal is about 600 nsec.

According to one embodiment, to image a single pixel on the printing plate 221 using the apparatus 201, the radio frequency of the acoustic wave in each AOM needs to be turned on for 600 nsec, and consecutively for all the 3 AOMs. The overall time period for the radio frequency to be on is therefore 1800 nsec, or 1.8 μsec. That corresponds to a maximum switching frequency of approximately 555 kHz.

For an image file with a resolution of 1800 dots per inch (DPI), each pixel has a diameter of 14 μm, Suppose this is 14 μm×14 μm. The maximum imaging speed of this system is the approximated as:

14 μm×14 μm×555 kHz≈0.39 $m^2$/h.

In comparison, a direct engraving system using a $CO_2$ laser and AOMs made from Germanium, which has a typical acoustic velocity of 5.5 mm/μsec and a laser beam with 10.6 μm wavelength and 7 mm beam diameter, results in a lower switching frequency of 262 kHz and consequently a lower maximum imaging speed for the same image file:

14 μm×14 μm×262 kHz≈0.18 $m^2$/h.

It is clear that the apparatus 201 using a fiber laser and $TeO_2$ AOMs provides significantly higher productivity than a $CO_2$ laser with Germanium AOMs.

Figure 4:
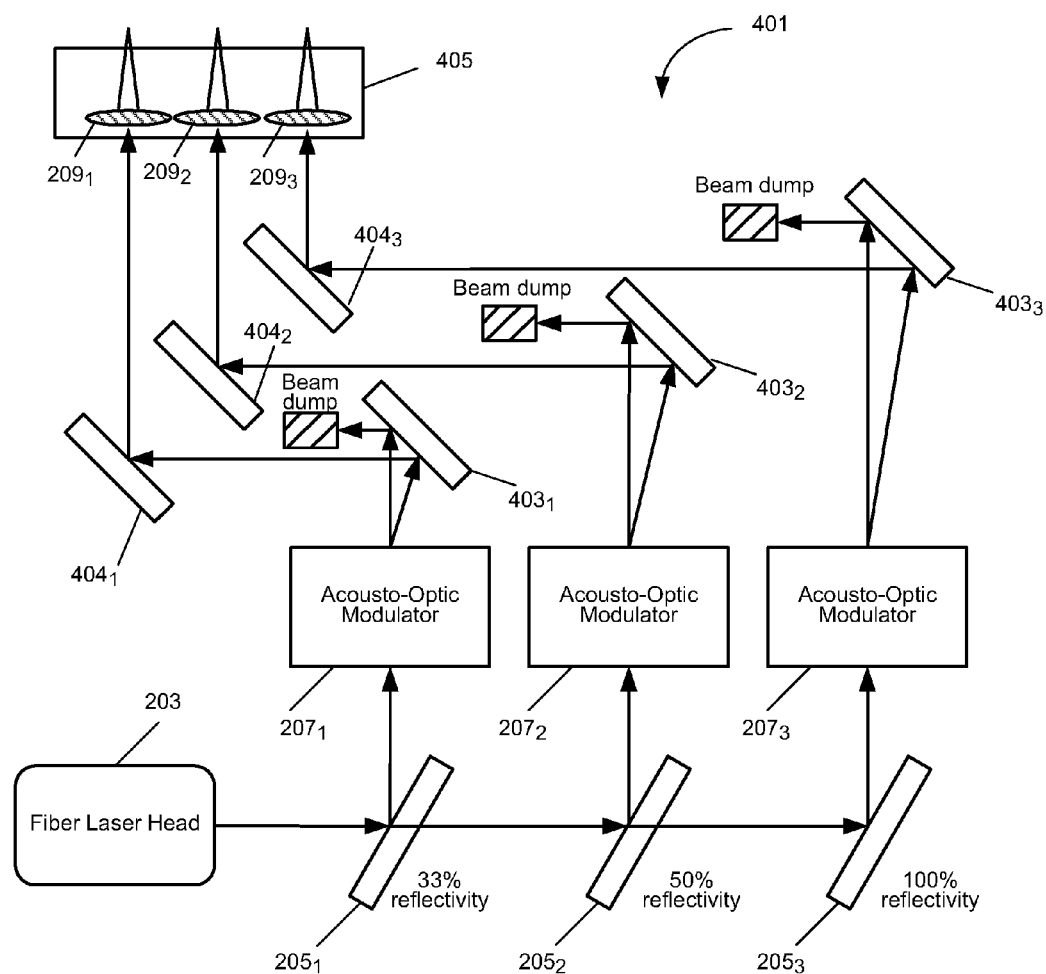
FIG. 4 is a simplified schematic diagram illustrating an apparatus for multi-beam direct engraving according to another embodiment of the present invention.

FIG. 4 shows, according to an alternate embodiment, another example apparatus 401 that operates similarly to the apparatus 201. The apparatus 401 also includes the laser source 203, the set of reflective mirrors $205_n$, n=1, 2, 3, the acousto-optic modulators $207_n$, n=1, 2, 3, and the focusing lens $209_n$, n=1, 2, 3. The apparatus 401 further includes two reflectors $403_n$, $404_n$, n=1, 2, 3 for each split laser beam. The reflectors $403_n$, $404_n$, n=1, 2, 3, in one embodiment being mirrors having 100% reflectivity, are placed in the beam path between the optical-beam modulator $207_n$, n=1, 2, 3 and the focusing lens $209_n$, n=1, 2. All the reflectors $403_n$, $404_n$, n=1, 2, 3 for the beams are folded in the same plane such that the reflected beams remain parallel and the focal spots of the beams build a row on the printing plate 221 along the axial direction of the imaging drum 223. Compared to the apparatus 201, by having the reflectors $403_n$, $404_n$, n=1, 2, 3, the apparatus 401 allows the focused beams to be placed more closely together for engraving different depth levels of an image pattern.

The apparatus 401 also includes a processing head 405 that includes the focusing lenses for the split beams. Thus, in this embodiment, all the focused beams are applied to the printing plate through the processing head 405.

Figure 5A:
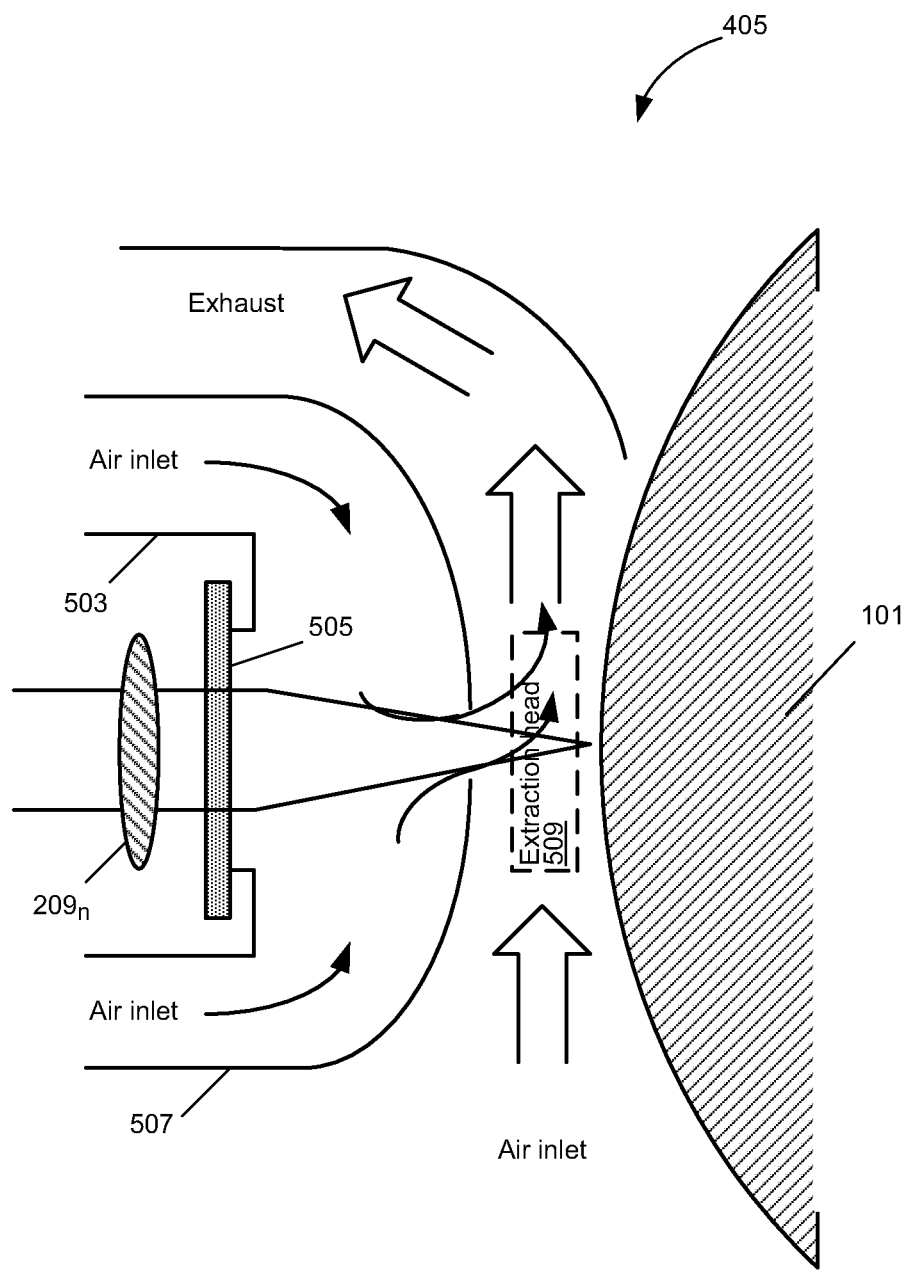
FIG. 5A is a simplified schematic diagram illustrating a processing head used in a direct engraving apparatus to avoid melting of small details on a printing plate, according to one embodiment of the present invention.
Figure 5B:
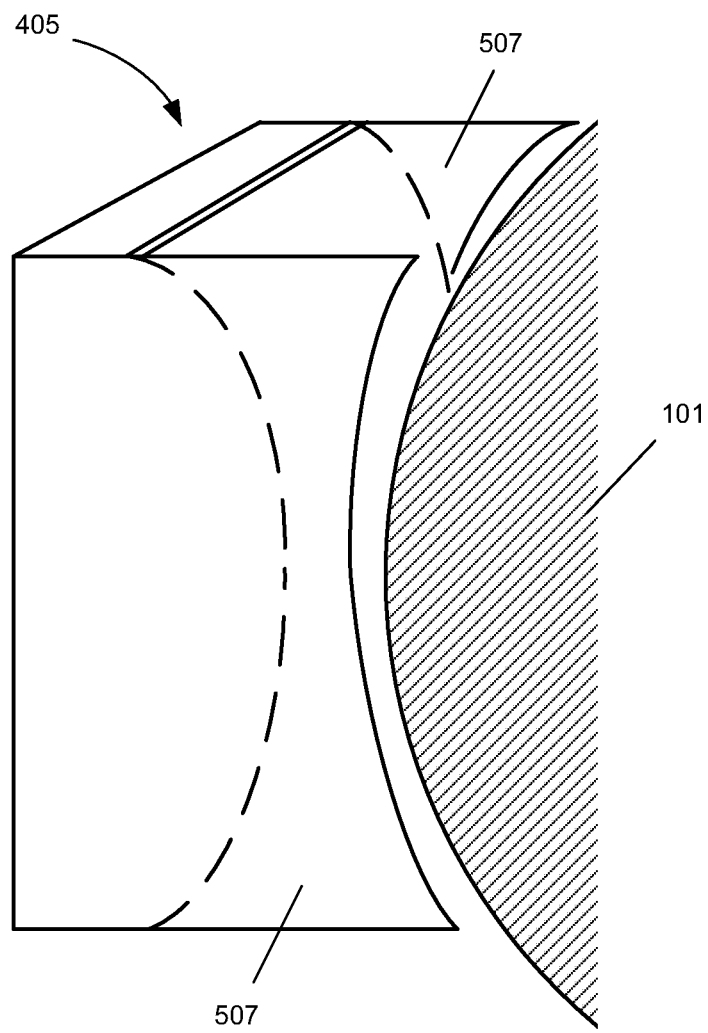
FIG. 5B is a simplified schematic diagram illustrating side walls of a metal shield included in the processing head shown in FIG. 5A.

In one embodiment, processing head 405 provides dust extraction and air flushing for protection of the lens optics. FIGS. 5A and 5B provide closer simplified views for the processing head 405. FIG. 5A shows a cross-section view of the processing head 405. The processing head 405 is directly attached to an optic enclosure 503 that contains the focusing lenses. One such lens $209_n$ is schematically shown. The processing head 405 also comprises an extraction head 509 shown in simplified schematic form in FIG. 5A. The extraction head is connected to a hose leading to an exhaust unit, and removes any ablated material by the laser beams into the exhaust unit. In one embodiment, the focusing lenses are placed approximately 25 mm away from each other, such that any evaporated elastomer can be extracted by the extraction head.

For protection of the lenses against ablated elastomer dust, a protection window 505 is placed in front of the focusing lenses 209. For further protection of the window 505, a metal shield 507 is placed in approximately half the distance between the protection window 505 and the elastomer surface of the printing plate 221. The metal shield 507 has small openings, e.g., small holes at the locations where the focused laser beams travel through. The metal shield 507 has a curvature the normal vector of which is pointing towards the printing plate, and hence creates a bottleneck together with the curvature of the printing plate 221, which is attached to the imaging drum 223. This arrangement forms a Venturi nozzle, which increases the velocity of the exhaust air stream at the place where the focused beams goes through the openings of the shield metal and hit the plate surface.

In one embodiment, the space between the protection window 505 and the metal shield 507 has wide openings to the rear side, i.e., in the direction moving away from the plate surface. Air inlet hoses are attached to these openings and provide clean air, flushing into the space behind the metal shield 507. Air leaves the space behind the metal shield 507 through the openings/holes for the focused laser beams. This air movement is enforced by the Venturi effect caused by the high velocity of the extracted air.

FIG. 5B shows a simplified perspective view of the processing head 405. In one embodiment, the metal shield 507 has side walls at the two ends. The side walls impose limits on the movement of the extraction head 509 and the space between the focusing lenses 209 and the metal shield 507. The Venturi nozzle between the metal shield 507 and the printing plate 221 is also limited at the side walls.

Figure 6:
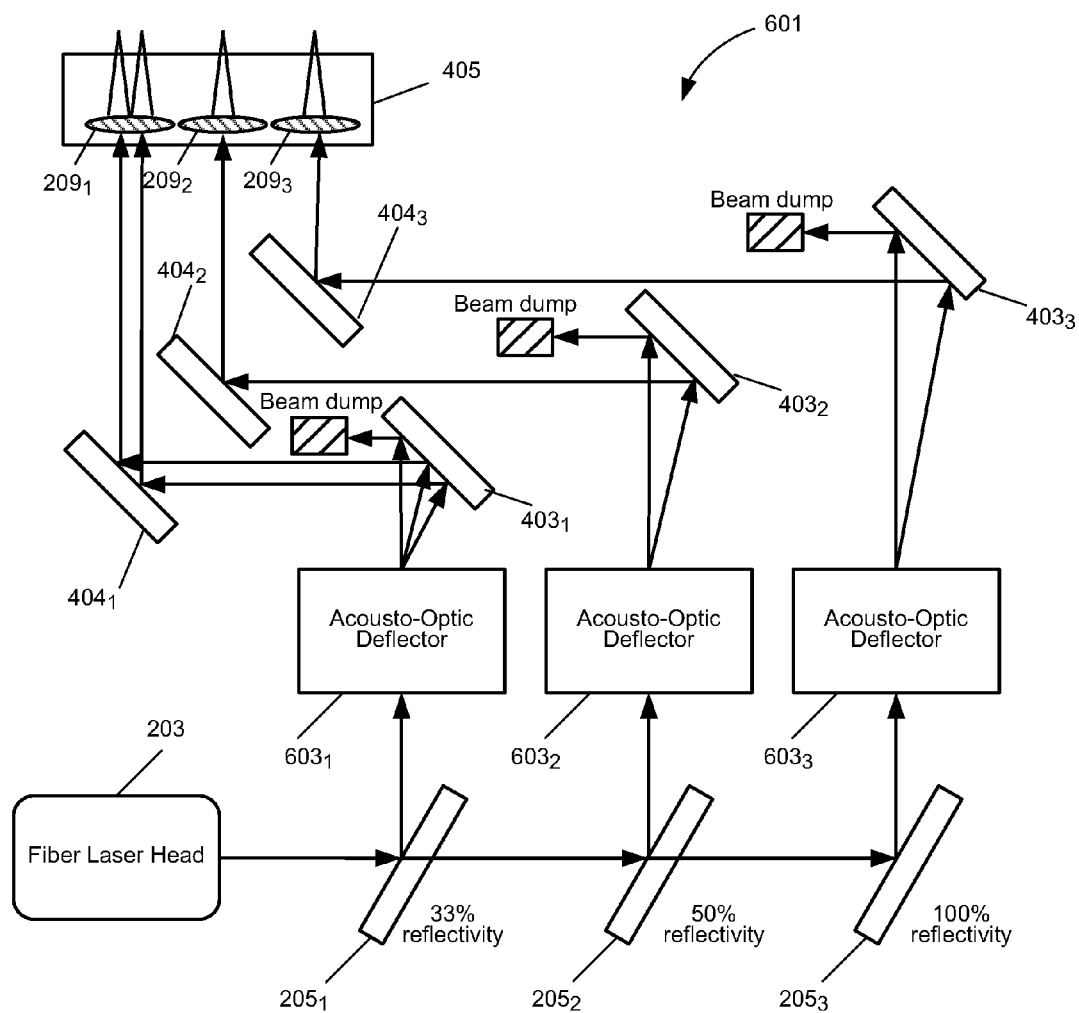
FIG. 6 is a simplified schematic diagram illustrating an apparatus for multi-beam direct engraving according to yet another embodiment of the present invention.

FIG. 6 shows, according to an alternate embodiment, another example apparatus 601 that has similar operating principle to the apparatus 401. The apparatus 601 again includes the laser source 203, the set of reflective mirrors $205_n$, n=1, 2, 3, the focusing lens $209_n$, n=1, 2, 3, the reflectors $403_n$, $404_n$, n=1, 2, 3, and the processing head 405. In contrast to the apparatus 401, in the apparatus 601, each optical-beam modulator for a split laser beam is an acousto-optic deflector (AOD) $603_n$, n=1, 2, 3 instead of an acousto-optic modulator (AOM) of the embodiments of FIG. 4. An AOD allows both the amplitude and frequency of a diffracted laser beam to be adjusted through modulation, whereas an AOM may only adjust amplitude, i.e., intensity of the diffracted laser beam. An AOD also has a deflection range, within which the angle/position of the output beam can be adjusted.

Any of the AODs $603_n$, n=1, 2, 3 may be used to create more than one modulated beam from a single split beam. This is achieved by applying multiple radio frequencies to one or more of the AODs $603_n$, n=1, 2, 3. FIG. 6 shows, in one embodiment, two modulated beams are generated by one AOD $603_1$. Note that, while FIG. 6 shows that only two modulated beams are generated by one AOD, there may be more than one of the AODs $603_n$, n=1, 2, 3 used to generate multiple modulated beams, and more than two modulated beams may be generated by one or more of the AODs $603_n$, n=1, 2, 3. What is shown in FIG. 6 is for illustration, and many configurations and combinations are possible in different embodiments of the invention, as would be clear to those skilled in the art.

By generating and using multiple modulated beams for one or more of the split beams, engraving productivity can be greatly increased over generating one modulated beam per split beam.

The engraving depth level needs to be sufficiently low in order to use multiple modulated beams from a single split beam and place them directly next to each other. As the depth level increases, placing more beams directly next to each other and using them at the same time may form saw-tooth structures in the ground of the engraved areas, and cause melting effects in fine image details on the plate surface.

The number and size of the first depth level beams determine the step size for the processing head 405, which means that the beam diameter of the beams for the other depth levels, i.e., depth levels 2, 3 . . . , shall increase accordingly.

In one embodiment, there are four first-depth-level beams, two second-depth-level beams, and one third-depth-level beam.

In another example configuration with four split beams, there are eight first-depth-level beams, four second-depth-level beams, two third-depth-level beams, and one fourth-depth-level beam.

Each increment in a depth level doubles the size of the modulated beams belonging to that level. For example, if four first-depth-level beams have a beam diameter of 12.7 µm, the two second depth level beams will have a size of 25.4 µm, and the one third depth level beam will have a 51 µm beam diameter.

Because the engraving in lower depth levels are to form support shoulders to image patterns engraved at the first depth level, i.e., the surface of the printing plate 221, using more than one beam in lower depth levels can be deemed equivalent to increasing the focal spot size of these beams.

In order to use multiple beams to engrave one image pattern, the focused laser beams of different depth levels are positioned and aligned on the printing plate surface to ensure precise overlay of the surface and shoulder layers. Beam positioning is carried out in both the engraving direction, which is the drum imager embodiment is the axial direction, also called horizontal direction (FIG. 7A), and in the circumferential, also called vertical direction (FIG. 7B). The axial direction is the engraving direction.

Figure 7A:
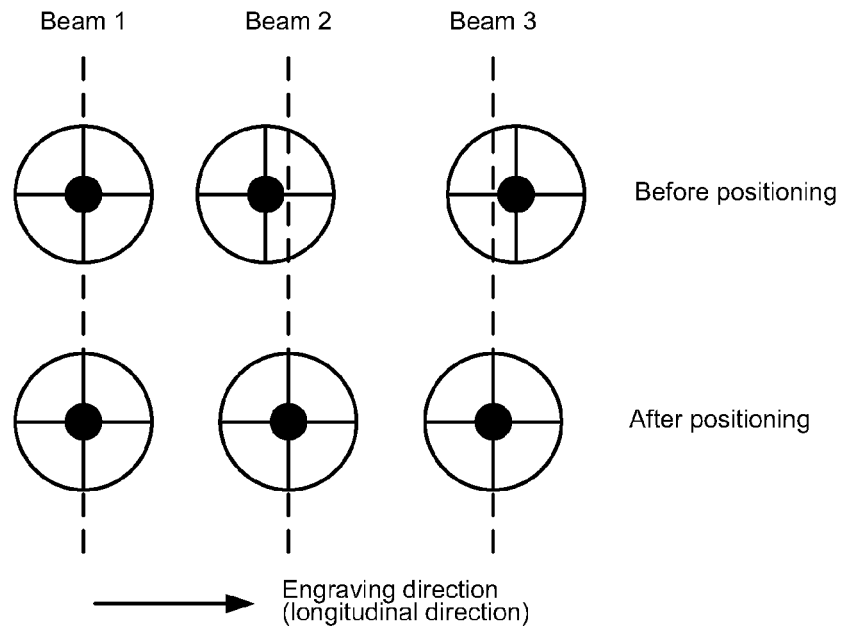
FIG. 7A is a simplified schematic diagram illustrating aligning focal spots of multiple laser beams on a printing plate in an axial direction.
Figure 7B:
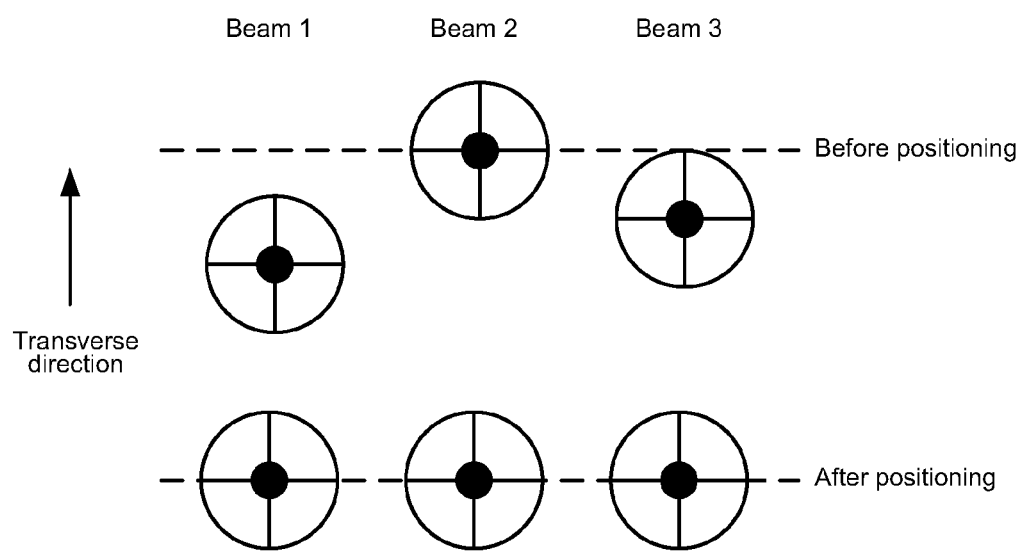
FIG. 7B is a simplified schematic diagram illustrating aligning focal spots of multiple laser beams on a printing plate in a circumferential direction.

FIG. 7A shows an illustration of beam positioning in the axial direction in an apparatus embodiments such as 401 or 601. Firstly, image patterns to be engraved by the different beams are arranged with a certain distance apart from each other, in one embodiment an equal distance so that the beams are equally spaced. The deflection ranges of the AOMs $207_n$, n=1, 2, 3, or AODs $603_n$, n=1, 2, 3, are then used to fine tune the horizontal positions of and correct any misalignment. In FIG. 7A, Beam 2 and Beam 3 need to be aligned.

FIG. 7B shows an illustration of beam positioning in the circumferential direction using an apparatus such as 401 or 601. The vertical positions of the focused beams are adjusted by delaying the input to the AOMs $207_n$, n=1, 2, 3, or AODs $603_n$, n=1, 2, 3 for one or more of the beams accordingly. FIG. 7B shows, in one example, delaying Beam 3 and Beam 1 bring them into the same vertical position on the elastomeric surface as Beam 2.

The alignment procedure can be made semiautomatic. To align a second beam with a first beam, for example, a crosshair pattern may first be engraved by the first beam. Next, a set of crosshairs are engraved by the second beam by continuously varying the horizontal or vertical position of the second beam and engrave one crosshair for each varied position. A machine operator can select after the engraving which crosshair by the second beam is placed perfectly on top of that by the first beam, and enter the corresponding configuration into the computer of the CDI. By repeating this process, the horizontal and vertical positions of multiple beams can be set accordingly.

Figure 8:
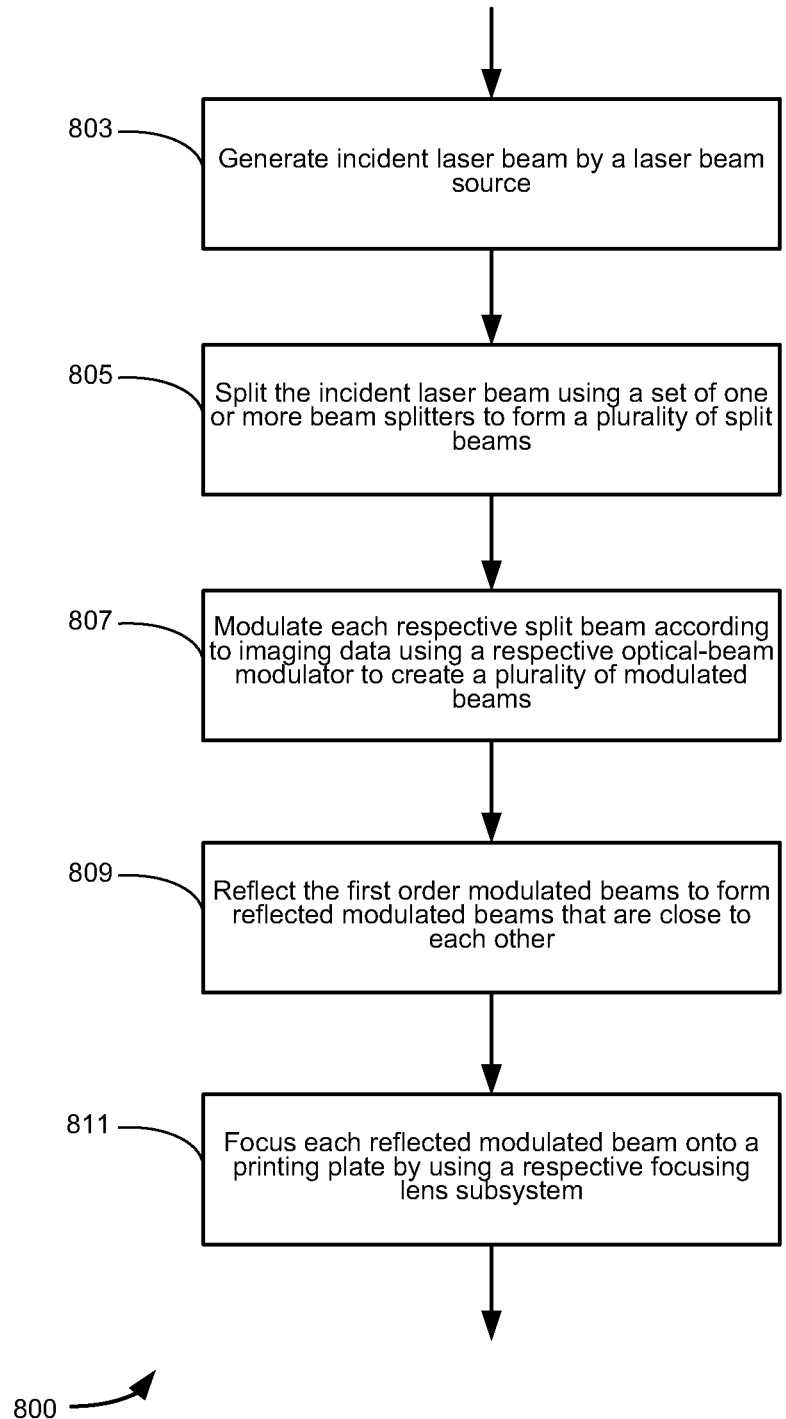
FIG. 8 is a flow chart of a method for multi-beam direct engraving according to one embodiment of the present invention.

FIG. 8 shows a flowchart of a method for operating a direct engraving apparatus such as apparatus 401 or 601. The method includes, in 803, generating an incident laser beam using a laser beam source, and in 805, splitting the incident laser beam using a set of one or more beam splitters to form a plurality of split beams. The method includes, in 807, modulating each respective split beam according to imaging data using a respective optical-beam modulator to create a plurality of modulated beams. As described above, in one version, the optical-beam modulator is an acousto-optic modulator, and in another version, an acousto-optic deflector. As a result, one or more modulated beams are created for each split beam. In 809, each modulated beam is reflected by one or more reflectors, e.g., mirrors with full reflectivity, such that the reflected modulated beams are placed closely together. Finally, in 811, each reflected beam is focused by a focusing subsystem onto the surface of an elastomeric printing plate to directly engrave the plate. Thus, direct engraving is performed.

The base for realization of some embodiments according to the present disclosure may be an external drum imager such as an ESKO® Cyrel Digital Imager (CDI) or a Lino-type Hell® Imaging Device.

Unless specifically stated otherwise, as apparent from the following description, it is appreciated that throughout the specification discussions utilizing terms such as "processing," "computing," "calculating," "determining" or the like, may refer to, without limitation, the action and/or processes of hardware, e.g., an electronic circuit, a computer or computing system, or similar electronic computing device, that manipulate and/or transform data represented as physical, such as electronic, quantities into other data similarly represented as physical quantities.

In a similar manner, the term "processor" may refer to any device or portion of a device that processes electronic data, e.g., from registers and/or memory to transform that electronic data into other electronic data that, e.g., may be stored in registers and/or memory. A "computer" or a "computing machine" or a "computing platform" may include one or more processors.

Note that when a method is described that includes several elements, e.g., several steps, no ordering of such elements, e.g., of such steps is implied, unless specifically stated.

The methodologies described herein are, in some embodiments, performable by one or more processors that accept logic, instructions encoded on one or more computer-readable media. When executed by one or more of the processors, the instructions cause carrying out at least one of the methods described herein. Any processor capable of executing a set of instructions (sequential or otherwise) that specify actions to be taken is included. Thus, one example is a typical processing system that includes one or more processors. Each processor may include one or more of a CPU or similar element, a graphics processing unit (GPU), field-programmable gate array, application-specific integrated circuit, and/or a programmable DSP unit. The processing system further includes a storage subsystem with at least one storage medium, which may include memory embedded in a semiconductor device, or a separate memory subsystem including main RAM and/or a static RAM, and/or ROM, and also cache memory. The storage subsystem may further include one or more other storage devices, such as magnetic and/or optical and/or further solid state storage devices. A bus subsystem may be included for communicating between the components. The processing system further may be a distributed processing system with processors coupled by a network, e.g., via network interface devices or wireless network interface devices. If the processing system requires a display, such a display may be included, e.g., a liquid crystal display (LCD), organic light emitting display (OLED), or a cathode ray tube (CRT) display. If manual data entry is required, the processing system also includes an input device such as one or more of an alphanumeric input unit such as a keyboard, a pointing control device such as a mouse, and so forth. The term storage device, storage subsystem, or memory unit as used herein, if clear from the context and unless explicitly stated otherwise, also encompasses a storage system such as a disk drive unit. The processing system in some configurations may include a sound output device, and a network interface device.

In some embodiments, a non-transitory computer-readable medium is configured with, e.g., encoded with instructions, e.g., logic that when executed by one or more processors of a processing system such as a digital signal processing device or subsystem that includes at least one processor element and a storage subsystem, cause carrying out a method as described herein. Some embodiments are in the form of the logic itself. A non-transitory computer-readable medium is any computer-readable medium that is statutory subject matter under the patent laws applicable to this disclosure, including Section 101 of Title 35 of the United States Code. A non-transitory computer-readable medium is for example any computer-readable medium that is not specifically a transitory propagated signal or a transitory carrier wave or some other transitory transmission medium. The term "non-transitory computer-readable medium" thus covers any tangible computer-readable storage medium. In a typical processing system as described above, the storage subsystem thus includes a computer-readable storage medium that is configured with, e.g., encoded with instructions, e.g., logic, e.g., software that when executed by one or more processors, causes carrying out one or more of the method steps described herein. The software may reside in the hard disk, or may also reside, completely or at least partially, within the memory, e.g., RAM and/or within the processor registers during execution thereof by the computer system. Thus, the memory and the processor registers also constitute a non-transitory computer-readable medium on which can be encoded instructions to cause, when executed, carrying out method steps. Non-transitory computer-readable media include any tangible computer-readable storage media and may take many forms including non-volatile storage media and volatile storage media. Non-volatile storage media include, for example, static RAM, optical disks, magnetic disks, and magneto-optical disks. Volatile storage media includes dynamic memory, such as main memory in a processing system, and hardware registers in a processing system.

While the computer-readable medium is shown in an example embodiment to be a single medium, the term "medium" should be taken to include a single medium or multiple media (e.g., several memories, a centralized or distributed database, and/or associated caches and servers) that store the one or more sets of instructions.

Furthermore, a non-transitory computer-readable medium, e.g., a computer-readable storage medium may form a computer program product, or be included in a computer program product.

In alternative embodiments, the one or more processors operate as a standalone device or may be connected, e.g., networked to other processor(s), in a wired and/or wireless networked deployment, or the one or more processors may operate in the capacity of a server or a client machine in server-client network environment, or as a peer machine in a peer-to-peer or distributed network environment. The term processing system encompasses all such possibilities, unless explicitly excluded herein. The one or more processors may form a personal computer (PC), a media playback device, a headset device, a hands-free communication device, a tablet PC, a set-top box (STB), a Personal Digital Assistant (PDA), a game machine, a cellular telephone, a Web appliance, a network router, switch or bridge, or any machine capable of executing a set of instructions (sequential or otherwise) that specify actions to be taken by that machine.

Note that while some diagram(s) only show(s) a single processor and a single storage subsystem, e.g., a single memory that stores the logic including instructions, those skilled in the art will understand that many of the components described above are included, but not explicitly shown or described in order not to obscure the inventive aspect. For example, while only a single machine is illustrated, the term "machine" shall also be taken to include any collection of machines that individually or jointly execute a set (or multiple sets) of instructions to perform any one or more of the methodologies discussed herein.

Thus, as will be appreciated by those skilled in the art, embodiments of the present invention may be embodied as a method, an apparatus such as a special purpose apparatus, an apparatus such as a data processing system, logic, e.g., embodied in a non-transitory computer-readable medium, or a computer-readable medium that is encoded with instructions, e.g., a computer-readable storage medium configured as a computer program product. The computer-readable medium is configured with a set of instructions that when executed by one or more processors cause carrying out method steps. Accordingly, aspects of the present invention may take the form of a method, an entirely hardware embodiment, an entirely software embodiment or an embodiment combining software and hardware aspects. Furthermore, the present invention may take the form of program logic, e.g., a computer program on a computer-readable storage medium, or the computer-readable storage medium configured with computer-readable program code, e.g., a computer program product.

It will also be understood that embodiments of the present invention are not limited to any particular implementation or programming technique and that the invention may be implemented using any appropriate techniques for implementing the functionality described herein. Furthermore, embodiments are not limited to any particular programming language or operating system.

Reference throughout this specification to "one embodiment," "an embodiment," "some embodiments," or "embodiments" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the above description of example embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the DESCRIPTION OF EXAMPLE EMBODIMENTS are hereby expressly incorporated into this DESCRIPTION OF EXAMPLE EMBODIMENTS, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those skilled in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the invention.

In the description provided herein, numerous specific details are set forth. However, it is understood that embodiments of the invention may be practiced without these specific details. In other instances, well-known methods, structures and techniques have not been shown in detail in order not to obscure an understanding of this description.

As used herein, unless otherwise specified, the use of the ordinal adjectives "first", "second", "third", etc., to describe a common object, merely indicate that different instances of like objects are being referred to, and are not intended to imply that the objects so described must be in a given sequence, either temporally, spatially, in ranking, or in any other manner.

All U.S. patents, U.S. patent applications, and International (PCT) patent applications designating the United States cited herein are hereby incorporated by reference, except in those jurisdictions that do not permit incorporation by reference, in which case the Applicant reserves the right to insert any portion of or all such material into the specification by amendment without such insertion considered new matter. In the case the patent Rules or Statutes do not permit incorporation by reference of material that itself incorporates information by reference, the incorporation by reference of the material herein excludes any information incorporated by reference in such incorporated by reference material, unless such information is explicitly incorporated herein by reference.

Any discussion of other art in this specification should in no way be considered an admission that such art is widely known, is publicly known, or forms part of the general knowledge in the field at the time of invention.

In the claims below and the description herein, any one of the terms comprising, comprised of or which comprises is an open term that means including at least the elements/features that follow, but not excluding others. Thus, the term comprising, when used in the claims, should not be interpreted as being limitative to the means or elements or steps listed thereafter. For example, the scope of the expression a device comprising A and B should not be limited to devices consisting of only elements A and B. Any one of the terms including or which includes or that includes as used herein is also an open term that also means including at least the elements/features that follow the term, but not excluding others. Thus, including is synonymous with and means comprising.

Similarly, it is to be noticed that the term coupled, when used in the claims, should not be interpreted as being limitative to direct connections only. The terms "coupled" and "connected," along with their derivatives, may be used, and mean operatively coupled. It should be understood that these terms are not intended as synonyms for each other, but may be. Thus, the scope of the expression "a device A coupled to a device B" should not be limited to devices or systems wherein an input or output of device A is directly connected to an output or input of device B. It means that there exists a path between device A and device B which may be a path including other devices or means in between, which may be, for example and without limitation electrical, mechanical, fluidic, magnetic, or wireless connections, by. Furthermore, coupled to does not imply direction. Hence, the expression "a device A is coupled to a device B" may be synonymous with the expression "a device B is coupled to a device A." "Coupled" may mean that two or more elements are either in direct physical or electrical contact, or that two or more elements are not in direct contact with each other but yet still co-operate or interact with each other.

In addition, use of the "a" or "an" are used to describe elements and components of the embodiments herein. This is done merely for convenience and to give a general sense of the invention. This description should be read to include one or at least one and the singular also includes the plural unless it is obvious that it is meant otherwise.

The present examples are to be considered as illustrative and not restrictive, and the examples are not to be limited to the details given herein, but may be modified within the scope of the appended claims. Thus, while there has been described what are believed to be the preferred embodiments of the invention, those skilled in the art will recognize that other and further modifications may be made thereto without departing from the invention, and it is intended to claim all such changes and modifications as fall within the scope of the invention, to the extent permitted by law. For example, to the extent permitted by law: any formulas given above are merely representative of procedures that may be used; functionality may be added or deleted from the block diagrams and operations may be interchanged among functional blocks; and steps may be added to or deleted from methods described within the scope of the present invention.

I claim:

1. An apparatus for laser engraving of printing plates or sleeves, the apparatus comprising:
    a laser source having sufficient power output to directly engrave an elastomeric printing plate or sleeve positioned on an imaging drum of a drum imager or on a flat bed of a flatbed imager, the drum of the drum imager being rotatable around a longitudinal axis, and having a longitudinal direction defined by the axis of rotation and a transverse direction defined along the circumference of the drum, the flatbed imager having a longitudinal direction and a transverse direction perpendicular to the longitudinal direction, the plate having an outer surface and an elastomeric body, the laser source when in operation emitting an incident laser beam;
    a set of one or more beam splitters operative to split the incident laser beam into a plurality of split beams;
    a plurality optical-beam modulators operative to simultaneously modulate the plurality of split beams, each respective optical-beam modulator controlled according to a respective portion of imaging data, to create one or more modulated beams from each split beam;
    a focusing subsystem for each split beam operative to focus the one or more modulated beams created from the split beam onto the printing plate;
    wherein a drive mechanism included in the drum imager or flatbed imager is operative to provide relative motion between the focused modulated beams and the plate in the transverse and longitudinal directions for modulating according to the respective portions of imaging data,
    wherein each focusing subsystem has a focal length and each focused modulated beam has a focal spot having a focal spot size on the outer surface of the plate, corresponding to being focused to a respective depth level in the plate,
    wherein at least two focusing subsystems have different focal lengths such that the focal spot sizes on the outer surface differ, and such that the outer surface of the printing plate is simultaneously engraved by a plurality of modulated beams of different respective focal spot sizes on the outer surface, and
    wherein the focal spots of the focused modulated beams build a row along the axial direction of the printing plate.

2. An apparatus as recited in claim 1, wherein the modulated beams are parallel to each other such that the focal spots of the focused modulated beams build the row along the axial direction of the printing plate.

3. An apparatus as recited in claim 1, wherein the plurality of split beams comprises at least three split beams.

4. An apparatus as recited in claim 1, wherein the set of one or more beam splitters comprises a set of reflective mirrors, each having a reflectivity factor and reflecting all of or a portion of an incident laser beam according to the reflectivity factor.

5. An apparatus as recited in claim 1, wherein a first focal spot and a second focal spot engrave at a first depth level and a second depth level, receptively, in the body of the printing plate, the second depth level deeper than the first depth level, and wherein the focal spot is larger than the second focal spot.

6. An apparatus as recited in claim 1, further comprising:
    one or more reflectors arranged between each of the optical-beam modulators and the focusing subsystem of said each optical-beam modulator to reflect each modulated beam, such that the modulated beams from different split beams are parallel.

7. An apparatus as recited in claim 1, wherein at least one optical-beam modulator is an acousto-optic deflector capable of creating a plurality of modulated beams from one split beam.

8. An apparatus as recited in claim 1, wherein the modulators are acousto-optic deflectors each having a deflection range, the deflection ranges being applicable to align the modulated beams with respect to each other in the axial direction.

9. An apparatus as recited in claim 1, further comprising a delayer for a split beam, the delayer applicable to delay the split beam to the modulator, such that the modulated beams are aligned with respect to each other in the transverse direction.

10. An apparatus as recited in claim 1, further comprising a processing head, wherein all focusing lenses for the split beams are contained in the processing head.

11. An apparatus as recited in claim 1, wherein in the case there is a space between the focusing lenses and the printing plate, the space is separated by a metal shield, the metal shield having openings to allow the focused modulated beams to propagate onto the printing plate, the metal shield having a curvature having a normal vector toward the printing plate, forming a Venturi nozzle that prevents dust from entering the space between the metal shield and the focus lenses.

* * * * *